(12) United States Patent
Russell

(10) Patent No.: US 10,013,192 B2
(45) Date of Patent: Jul. 3, 2018

(54) SOFT ERROR DETECTION IN A MEMORY SYSTEM

(71) Applicant: FREESCALE SEMICONDUCTOR, INC., Austin, TX (US)

(72) Inventor: Andrew C. Russell, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/239,563

(22) Filed: Aug. 17, 2016

(65) Prior Publication Data

US 2018/0052615 A1 Feb. 22, 2018

(51) Int. Cl.
| G11C 29/00 | (2006.01) |
| G06F 3/06 | (2006.01) |
| G06F 11/10 | (2006.01) |
| G11C 29/52 | (2006.01) |

(52) U.S. Cl.
CPC ............ *G06F 3/0619* (2013.01); *G06F 3/064* (2013.01); *G06F 3/0683* (2013.01); *G06F 11/1004* (2013.01); *G06F 11/1072* (2013.01); *G11C 29/52* (2013.01)

(58) Field of Classification Search
CPC ...... G06F 3/0619; G06F 3/064; G06F 3/0683; G06F 11/1062; G06F 11/1004; G11C 29/52
See application file for complete search history.

(56) References Cited

U.S. PATENT DOCUMENTS

| 4,725,899 A | 2/1988 | Gardner |
| 5,303,190 A | 4/1994 | Pelley, III |
| 6,766,431 B1 | 7/2004 | Moyer |
| 6,772,383 B1 | 8/2004 | Quach et al. |
| 7,012,835 B2 | 3/2006 | Gonzalez et al. |
| 7,100,004 B2 | 8/2006 | Johnson et al. |
| 7,434,012 B1 | 10/2008 | Ives et al. |
| 7,437,597 B1 | 10/2008 | Kruckemyer et al. |
| 7,564,093 B2 | 7/2009 | Matsuda |
| 7,573,773 B2 | 8/2009 | Lin |
| 7,606,980 B2 | 10/2009 | Qureshi et al. |
| 7,716,428 B2 | 5/2010 | Guthrie et al. |
| 7,863,579 B2 | 1/2011 | Suhami |
| 7,882,323 B2 | 2/2011 | Allison et al. |
| 7,900,100 B2 | 3/2011 | Gollub |
| 8,024,638 B2 | 9/2011 | Resnick et al. |
| 8,032,804 B2 | 10/2011 | Jeddeloh |
| 8,255,772 B1 | 8/2012 | Foley |

(Continued)

OTHER PUBLICATIONS

Zhang, W. et al., "Microarchitecture Soft Error Vulnerability Characterization and Mitigation under 3D Integration Technology", 41st IEEE/ACM International Symposium on Microarchitecture, 2008, pp. 435-446.

(Continued)

*Primary Examiner* — Sam Rizk

(57) ABSTRACT

An integrated circuit (IC) device including a first memory device, a second memory device stacked with the first memory device, and one or more memory controllers configured to detect a first error in data stored in the first memory device at a first physical location in the IC device, and upon detecting the first error, determine whether there is a second error in data stored in the second memory device in a second physical location in the IC device near the first physical location.

18 Claims, 5 Drawing Sheets

(56) References Cited

U.S. PATENT DOCUMENTS

| | | |
|---|---|---|
| 2003/0191888 A1 | 10/2003 | Klein |
| 2004/0199830 A1 | 10/2004 | Gilbert et al. |
| 2004/0243886 A1 | 12/2004 | Klein |
| 2005/0073884 A1 | 4/2005 | Gonzalez et al. |
| 2005/0240801 A1 | 10/2005 | Johnson et al. |
| 2006/0020850 A1* | 1/2006 | Jardine ............... G06F 11/1004 714/11 |
| 2007/0011513 A1 | 1/2007 | Biswas et al. |
| 2008/0109691 A1 | 5/2008 | Dieffenderfer et al. |
| 2009/0144503 A1 | 6/2009 | Faucher et al. |
| 2010/0070835 A1 | 3/2010 | Song et al. |
| 2010/0176841 A1 | 7/2010 | Jang et al. |
| 2010/0191990 A1 | 7/2010 | Zhang et al. |
| 2010/0192041 A1 | 7/2010 | Jeddeloh |
| 2010/0332900 A1 | 12/2010 | Yang |
| 2011/0029807 A1 | 2/2011 | Fry et al. |
| 2011/0066768 A1 | 3/2011 | Brittner et al. |
| 2011/0167319 A1 | 7/2011 | Jeddeloh |
| 2014/0052931 A1 | 2/2014 | Ramaraju et al. |

OTHER PUBLICATIONS

U.S. Appl. No. 14/693,788, Russell, A., "Soft Error Detection in a Memory System", filed Apr. 22, 2015.

IBM Techdocs FAQ: Power 6 Frequently Asked Question, "What is Hardware Assisted Memory Scrubbing and how is it used?", printed Jul. 13, 2012.

Wikipedia.org, "Error detection and correction, Error-correcting code," printed Jul. 13, 2012.

Wikipedia.org, "Memory scrubbing," printed Jul. 13, 2012.

R. Naseer et al., "The DF-Dice Storage Element for Immunity to Soft Errors," 48th Midwest Symposium on Circuits and Systems, Aug. 7-10, 2005 pp. 303-306.

S. Jahinuzzaman et al., "A Soft Tolerant 10T SRAM Bit-Cell With Differential Read Capability," IEEE Transactions on Nuclear Science, vol. 56, No. 6, Dec. 2009.

Tezzaron Semiconductor, "Soft Errors in Electronic Memory—A White Paper," Version 1.1, Jan. 5, 2004.

J. Barth et al., "A 45nm SOI Embedded DRAM Macro for POWER7(TM) 530319032MB On-Chip L3 Cache," IEEE International Solid-State Circuits Conference, Session 19, High-Performance Embedded Memory 19.1, 2010.

K. Flautner et al., "Drowsy Caches: Simple Techniques for Reducing Leakage Power," 29th Annual International Symposium on Computer Architecture, 2002.

F. Ootsuka et al., "A Novel 0.25 Full CMOS SRAM Cell Using Stacked Cross Couple With Enhanced Soft Error Immunity," Proc. Int. Electron Devices Meeting, 1998, pp. 205-208.

Notice of Allowance dated Jul. 28, 2017 for U.S. Appl. No. 14/693,788, 7 pages.

Final Office Action dated May 19, 2017 for U.S. Appl. No. 14/693,788, 18 pages.

Non-Final Office Action dated Nov. 16, 2016 for U.S. Appl. No. 14/693,788, 15 pages.

Non-Final Office Action dated Aug. 15, 2014 for U.S. Appl. No. 13/588,243, 10 pages.

Notice of Allowance dated Mar. 18, 2015 for U.S. Appl. No. 13/588,243, 5 pages.

* cited by examiner

SOFT ERROR DETECTION IN A MEMORY SYSTEM

BACKGROUND

Field

This disclosure relates generally to memory systems, and more specifically, to soft error detection in a memory system.

Related Art

Radiation from charged particles, like alpha particles, can change the logic state of a memory cell in a memory. When a memory line or cache line is read and a soft error is detected, error correction code (ECC) can be used to correct the error and write the corrected data back to the memory. Typically, ECC is used to correct single bit errors. However, due to the path of the charged particle through silicon, soft errors are likely to be found in the vicinity of other soft errors. Therefore, the particle that caused the detected soft error may also have flipped other bits belonging to other memory lines in nearby areas of the memory. In the case of a stacked die configuration, the particle that caused the detected soft error may also have flipped other bits in nearby memories that are stacked over or below the memory. If soft errors are not adequately corrected, they can accumulate to a point at which they are not correctable by ECC. Therefore, a need exists for a soft error detection scheme which prevents the occurrence of errors in stacked die configurations which are not correctable by ECC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Due to the path of the charged particle through silicon, soft errors are likely to be found in the vicinity of other soft errors. In the case of multiple stacked die, the charged particle can cause bit errors at any die level of the stacked die. A bit error on one die level suggests there could be errors on other die levels. Therefore, when a bit error (i.e. flipped bit) due to a soft error is detected at a physical location at one die level of a stacked die device, such as through the use of ECC, bit cells near that same physical location at other die levels of the stacked die device are searched for additional bit errors.

Figure 1:
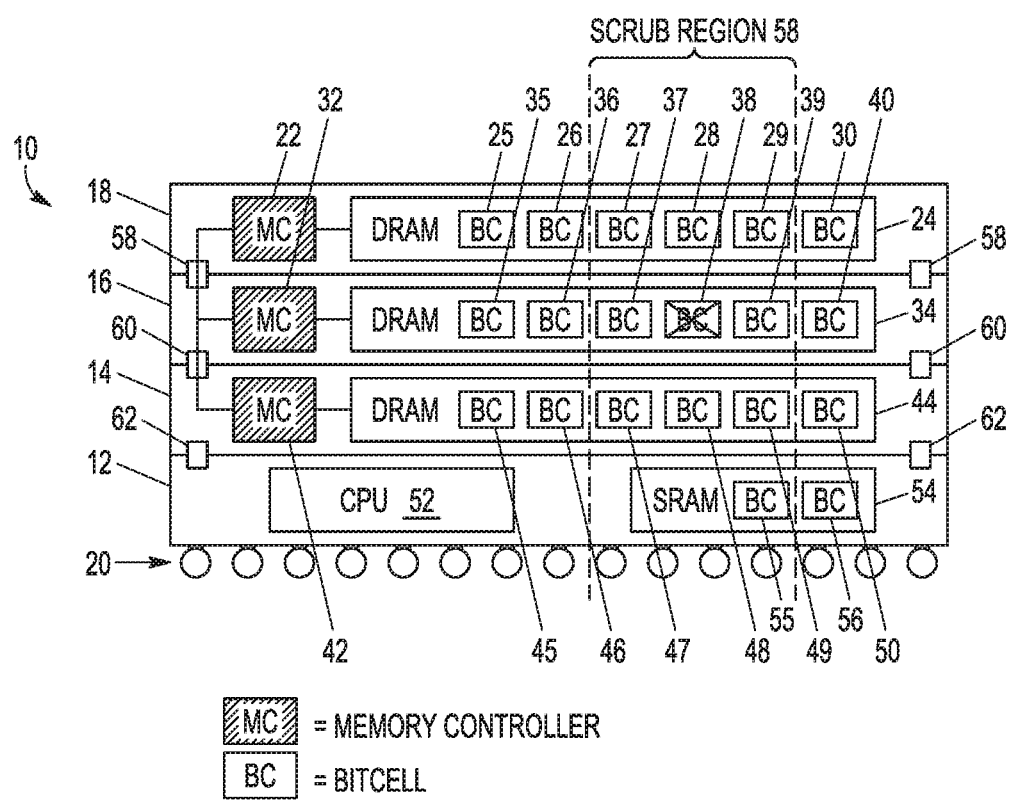
FIG. 1 illustrates, in block diagram form, a stacked die system including multiple die levels, in accordance with one embodiment of the present invention.

FIG. 1 illustrates a stacked die system 10 including multiple die levels, in accordance with one embodiment of the present invention. Stacked die system 10 (which may also be referred to as an integrated circuit (IC) device or a packaged IC device) includes 4 stacked die: die 12, die 14, die 16, and die 18. Each die corresponds to a different die level, and thus, the reference numerals 12, 14, 16, and 18 can also be used to refer to the different die levels which contain the corresponding die. In the illustrated embodiment, each die is of the same size and stacked aligned with each other. However, as will be discussed further below, each stacked die can be of a different size and not aligned to another die. Each adjacent die can be coupled to each other by way of through silicon vias (TSVs), such as TSVs 58 between die 18 and 16, TSVs 60 between die 16 and 14, and TSVs 62 between die 14 and 12. Solder balls 20 may be formed across a bottom surface of the stacked die to connect stacked die system 10 to a printed circuit board (PCB). Therefore, through the use of TSVs, each of the die may communicate information between each other, as needed. Communication can be between all die, or communication can be between die 12 and each of die 14, 16, and 18, in which case there may not be direct communication between die 14 and 16, between die 16 and 18, and between die 14 and 18.

In the illustrated embodiment, each die includes a memory device. For example, die 18 includes a dynamic random access memory (DRAM) 24 and a corresponding memory controller (MC) 22 coupled to DRAM 24. Die 16 includes a DRAM 34 and a corresponding MC 32 coupled to DRAM 34. Die 14 includes a DRAM 44 and a corresponding MC 42 coupled to DRAM 44. Die 12 includes a static random access memory (SRAM) 54. Die 12 also includes a central processing unit (CPU) 52 that is coupled to SRAM 54. In the illustrated embodiment, CPU 52 is able to communicate with each of MC 22, 32, and 42, and each MC is able to communicate with the other MCs of system 10. DRAM 24 includes an array of bit cells (BCs) including BCs 25-30. DRAM 34 includes an array of BCs including BCs 35-40. DRAM 44 includes an array of BCs including BCs 45-50. SRAM 54 includes an array of BCs including BCs 55 and 56. Each of the BCs of the memory devices in system 10 is susceptible to soft errors caused by a charged particle.

In the example of FIG. 1, an "X" is illustrated in BC 38 indicating that BC 38 has an error due to a charged particle flipping the state of the bit cell. In response to finding this error in BC 38, a scrub region 58 can be identified and scrubbed (i.e. searched) in nearby memory devices to determine if there is an error in the location within the nearby memory devices that is close to the location of BC 38. Therefore, in response to detection of an error in a first die level, such as die level 16, nearby die levels, such as die levels 18, 14, and 12, can be searched for errors. Furthermore, specific scrub regions in each die level can be defined to provide regions within the nearby die levels to scrub. These scrub regions are near the location of the originally detected error (e.g. BC 38). Therefore, in one embodiment, in which the memory devices are a same type of memory device which use a same architecture, an address range around BC 38 can be searched in each nearby memory device. In an alternate embodiment, coordinates of the originally detected error (e.g. BC 38) can be determined with respect to a global origin of system 10, and the scrub region in nearby memory devices can be determined based on these coordinates.

Figure 2:
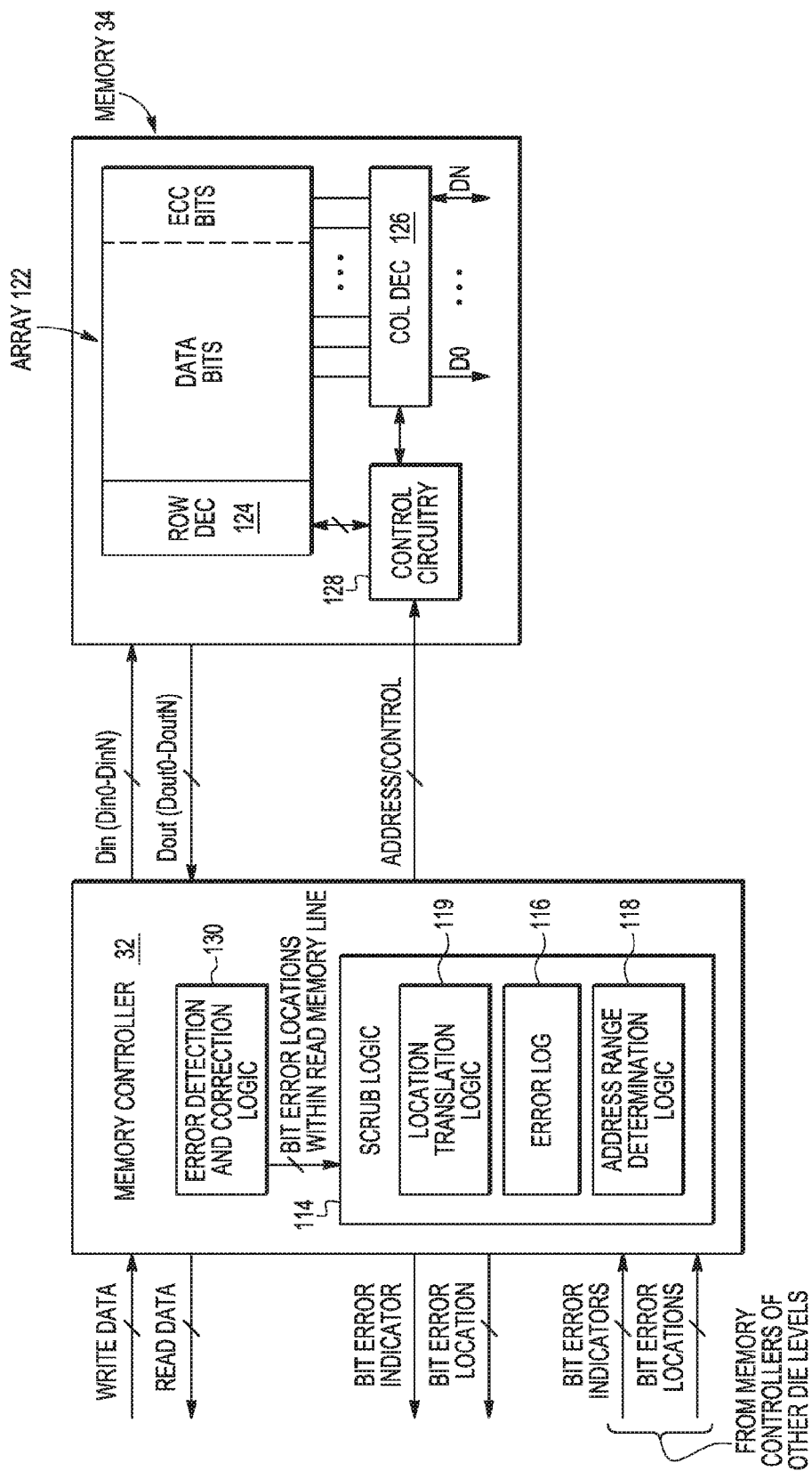
FIG. 2 illustrates, in block diagram form, a memory device of the stacked die system of FIG. 1, in accordance with one embodiment of the present invention.

FIG. 2 illustrates, in block diagram form, memory device 34 of stacked die system 10, in accordance with one embodiment of the present invention. Memory device 34 includes MC 32 as well as array 122. MC provides input data Din, which includes N+1 bits (Din0-DinN), and address/control information to memory device 34 and receives output data Dout, which includes N+1 bits (Dout0-DoutN), from memory device 34. Array 122 in memory device 34 is the array of BCs and includes BCs 35-40. Array 122 includes a portion which stores data bits and a portion which stores ECC bits. In one embodiment, each row of BCs in array 122 has data bits and ECC bits which correspond to the data bits. Memory device 34 also includes row decoder circuitry 124 coupled to array 122 and column decoder circuitry 126 coupled to array 122. Column decoder 126 couples addressed bit lines of array 122 to Din to receive write data for a write operation and couples addressed bit lines of array 122 to Dout to provide read data for a read operation. Control circuitry 128 receives address and control information from MC 32 and is coupled to row decoder 124 and column decoder 126.

MC 32 includes error detection and correction logic 130 and scrub logic 114. Error detection and correction logic 130 provides bit error locations within a read memory line to scrub logic 114. Scrub logic 114 includes location translation logic 119, error log 116, and address range determination logic 118. MC 32 receives write data, which can be received from CPU 52, and provides read data, which can be provided to CPU 52. Along with the read and write data provided and received at MC 32, address and control information is provided and received as well corresponding to the read and write data. A bit error indicator and bit error location is provided from scrub logic 114, and bit error indicators and corresponding bit error locations are received from elsewhere within system 10. Depending on the embodiment, the bit error indicator and bit error location can be provided to CPU 52 or to other MCs in other die levels, and the bit error indicators and bit error locations can be received from CPU 52 or from other MCs in other die levels. In the illustrated embodiment, it is assumed that the bit error indicator and bit error location is provided to the MCs of other die levels and the bit error indicators and bit error locations are received from MCs of other die levels.

In operation, a read or write access request can be provided to MC 32. In response thereto, an access address and control information, corresponding to either a write operation or a read operation, is provided by MC 32 to control circuitry 128 of memory device 34. Control circuitry 128 provides the appropriate portion of the access address to row decoder 124 to turn on the selected word lines and provides the appropriate portion of the access address to column decoder 126 to select the appropriate bit lines. The bit cells at the intersection of each selected word line and selected bit line store write data and corresponding ECC bits for a write operation or provide read data and corresponding ECC bits for a read operation.

For a write operation, the received write data is provided by MC 32 to error detection and correction logic 130 which determines ECC bits for the write data. The write data and the ECC bits are provided to memory device 34 as Din0-DinN in which a first portion of the N+1 bits is the write data and a remaining portion of the N+1 bits is the ECC value. Din0-DinN is provided as D0-DN to column decoder 126. Column decoder 126 couples the D0-DN lines to the selected bit lines in accordance with the decoded write address. In this manner, the values of D0-DN are stored into the selected bit cells. Note that the first portion of the N+1 bits are provided to the selected bit lines of the data portion of array 122 and the remaining portion of the N+1 bits are provided to the selected bit lines of the ECC portion of array 122.

For a read operation, the selected bit lines are sensed and the read data from the selected bit cells are provided on D0 to DN as Dout0-DoutN to error detection and correction logic 130. Error detection and correction logic 130 uses the ECC bits received as part of Dout from the ECC portion of array 122 and performs error detection and correction on the data bits received as part of Dout from the data portion of array 122. If no error is detected, MC 32 outputs Dout as the read data. If a bit error is detected which can be corrected, error detection and correction logic 130 corrects the data and MC 32 outputs the corrected data as the read data. Error detection and correction logic 130 also provides the location of the bit error to scrub logic 114, as will be discussed in further detail below with respect to FIG. 2.

Note that error detection and correction logic 130 may use any type of ECC scheme to detect, and if possible, correct errors. In one embodiment, the ECC scheme used to detect errors is capable of detecting and correcting a single bit error. This ECC scheme is also capable of detecting multiple bit errors, but cannot correct a multiple bit error. In this case, the detected error is not corrected, and an uncorrectable error can be signaled to memory controller 32. Also, note that error detection and correction logic 130 may be located outside of MC 32.

Figure 3:
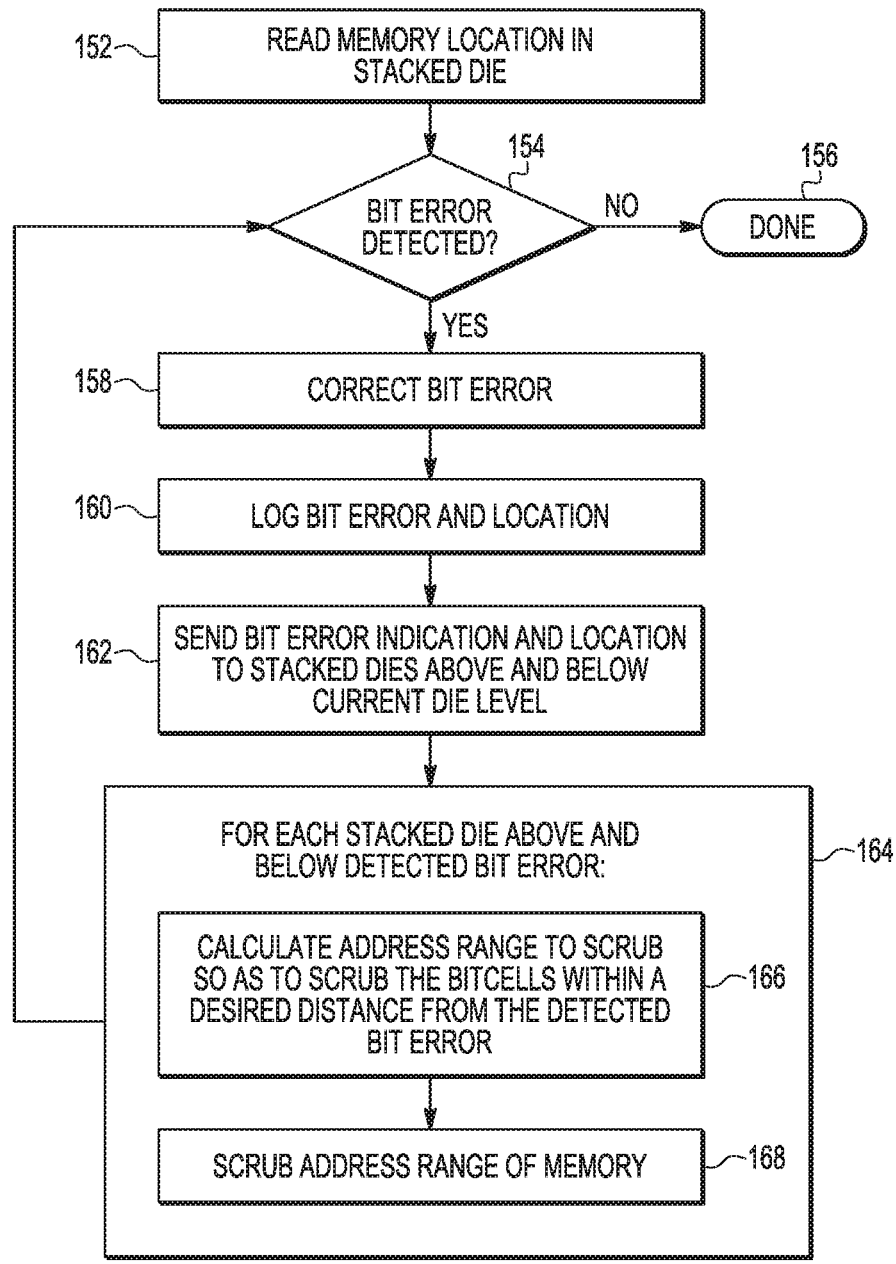
FIG. 3 illustrates, in flow diagram form, a method of soft error detection and correction within the stacked die system of FIG. 1, in accordance with one embodiment of the present invention.

FIG. 3 illustrates in flow diagram form, a method 150 for soft error detection and correction which may be performed by stacked die system 10. Method 150 begins in block 152 where, in response to a read request, an addressed memory location in stacked die system 10 is read. Referring to memory device 34 and MC 32 of FIG. 2 as an example, MC 32 receives a read request and provides address and control information for the read request to control circuitry 128. Control circuitry 128 provides the appropriate information to row decoder 124 and column decoder 126 to access the addressed memory line. The sensed data from the addressed memory line in array 122 is provided as Dout back to MC 32.

Method 150 proceeds to block 154 where it is determined if a bit error in the sensed data is detected. For example, error detection and correction logic 130 uses the ECC portion of the sensed data to determine if an error exists in the data portion of the sensed data. If no error is detected, method 150 ends at block 156. If an error is detected, method 150 proceeds to block 158, where, if possible, the bit error in the sensed data is corrected. The corrected sensed data can then be output as the read data by MC 32. If the bit error cannot be corrected, method 150 ends with an uncorrectable error. After the bit error is corrected, method 150 proceeds to block 160 in which the bit error and location is logged. For example, error detection and correction logic 130 provides the bit error location within the read memory line to scrub logic 114 which can log the error, including the error location, in error log 116. Therefore, error log 116 includes storage circuitry configured to store error information for each logged error.

Method 150 proceeds to block 162 in which a bit error indication and a corresponding bit error location is sent to the other stacked die in system 10 above and below the current die level. For example, if a bit error is found in memory device 34, a bit error indicator indicating an error and the corresponding bit location which was provided by location translation logic 119 is sent to both MC 42 of die 14 and MC 22 of die 18. The bit error location provides information as to the physical location of the bit error in the current die. It may include a variety of different formats and information types. For example, coordinates corresponding to a local origin of the die may be determined and sent. Location translation logic 119 may take the address of the memory line read and the detected error bit position within the memory line from error detection and correction logic 130 and translate the error location into local coordinates of the die level. In another example, once the local coordinates are determined with respect to an origin of the die, they can be translated to global coordinates with respect to a global origin for system 10. In this example, these global coordinates would be sent with the bit error indication. This may be performed, for example, by location translation logic 119 in scrub logic 114. Location translation logic 119 may use lookup tables to aid in the translation of bit error address and memory line bit position to local coordinates and from local coordinates to global coordinates.

Method 150 proceeds to block 164 in which, for each stacked die to which the error indicator is sent, above and below the die with the detected bit error, blocks 166 and 168 are performed. In block 166, an address range is calculated to provide a scrub region so that bit cells within a desired distance from the detected bit error can be scrubbed. The scrub region in each nearby memory device is physically near the physical location of the detected bit error in the current die level. Calculating the scrub region will be described further below. In one example, the scrub region of die 14 and 18 may correspond to an address range that includes BC 38. In this example, as seen in FIG. 1, the scrub region may be scrub region 58 for each of memory device 24 and 44. Since BCs 26, 27, and 28 of memory device 24 and BCs 47, 48, and 49 of memory device 44 are within scrub region 58, they will be scrubbed for errors due to the detected error in BC 38 of memory device 34.

Each MC in stacked system 10 is coupled to the other MCs in system 10 to receive any sent bit error indication and its corresponding location. Using die 16 of FIG. 1 as an example, when MC 32 of die 16 receives a bit error indicator and corresponding bit error location, location translation logic 119 translates the bit error location to a physical location within die 16. For example, the location translation logic 119 may convert received global coordinates of system 10 to local coordinates of die 16. Using the local coordinates, location translation logic 119 determines an address location of memory device 34 located at or very near the physical location identified by the local coordinates. In other embodiments, other types of location information may be provided with the bit error indication, and location translation logic 119 can use that information to determine an address location of memory device 34 corresponding to the physical location of the bit error which occurred in a memory device above or below memory device 34.

Once an address location in memory device 34 corresponding to the received bit error indication is determined, address range determination logic 118 can determine the scrub region. That is, address range determination logic 118 can determine which addresses or range of addresses are to be scrubbed for more bit errors. For example, the scrub region can be addresses which are physically adjacent to the determined address location of the bit error. The intent of the scrub region is to cover a region which includes the path of the charged particle which caused the bit error in the nearby memory device. Once the scrub region is determined, MC 32 can perform read accesses for the scrub region in array 122 and error detection and correction logic 130 can determine if any bit error is found, as was described above. Each MC of system 10 can do a similar procedure each time a bit error indication and corresponding bit error location is received from another MC in system 10. Each time a bit error is found, a scrub is triggered in another one or more die levels. This iterative process allows for all or most bit errors to be found in response to a charged particle.

Figure 4:
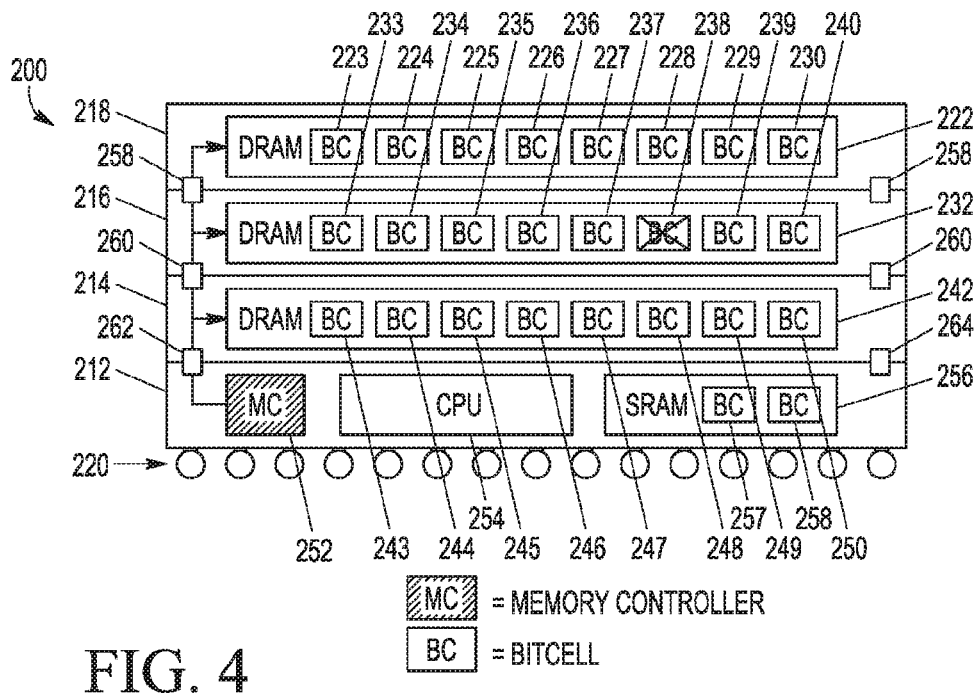
FIG. 4 illustrates, in block diagram form, a stacked die system including multiple die levels, in accordance with one embodiment of the present invention.

FIG. 4 illustrates a stacked die system 200 in accordance with another embodiment of the present invention. Stacked die system 200 (which may also be referred to as an integrated circuit (IC) device or a packaged IC device) includes 4 stacked die: die 212, die 214, die 216, and die 218. Each die corresponds to a different die level, and thus, the reference numerals 212, 214, 216, and 218 can also be used to refer to the different die levels which contain the corresponding die. Each adjacent die can be coupled to each other by way of TSVs, such as TSVs 258 between die 218 and 216, TSVs 260 between die 216 and 214, and TSVs 262 between die 214 and 212. Solder balls 220 may be formed across a bottom surface of the stacked die to connect stacked die system 200 to a PCB. In the illustrated embodiment, each die includes a memory device. For example, die 218 includes a DRAM 222. Die 216 includes a DRAM 232. Die 214 includes a DRAM 242. Die 212 includes an SRAM 256. DRAM 222 includes an array of bit cells (BCs) including BCs 223-330. DRAM 232 includes an array of BCs including BCs 233-240. DRAM 242 includes an array of BCs including BCs 243-250. SRAM 256 includes an array of BCs including BCs 257 and 258. Each of the BCs of the memory devices in system 200 is susceptible to soft errors cause by a charged particle.

Die 212 also includes a CPU 254 that is coupled to SRAM 256 and a memory controller (MC) 252 coupled to CPU 254 and SRAM 256. In the illustrated embodiment, CPU 254 is able to communicate with MC 252, and MC 252 is able to communicate with each of DRAM 222, 232, and 242 by way of the TSVs. MC 252 is shared among memories 242, 232, and 222. When a bit error is found by MC 252 in any of memory devices 242, 232, and 222, MC 252 can determine a scrub region based on the physical location of the detected bit error, as was described above with respect to MC 32. MC 252 can then perform a scrub of the scrub region in nearby memory devices, such as those above and below the memory device in which the bit error was found. Therefore, method 150 would also apply to system 200 except that a bit error exception and corresponding bit error location would not have to be sent to other MCs since MC 252 is shared among the memory devices. In this case, MC 252, in response to a detected bit error, may still translate the physical location to a global location of system 200 and then use the global location to determine an address in each nearby memory device around which to define a scrub region. In other alternate embodiments, some of the memory devices with a stacked die system may include their own MC while others share a MC. Therefore, different configurations are possible.

Figure 5:
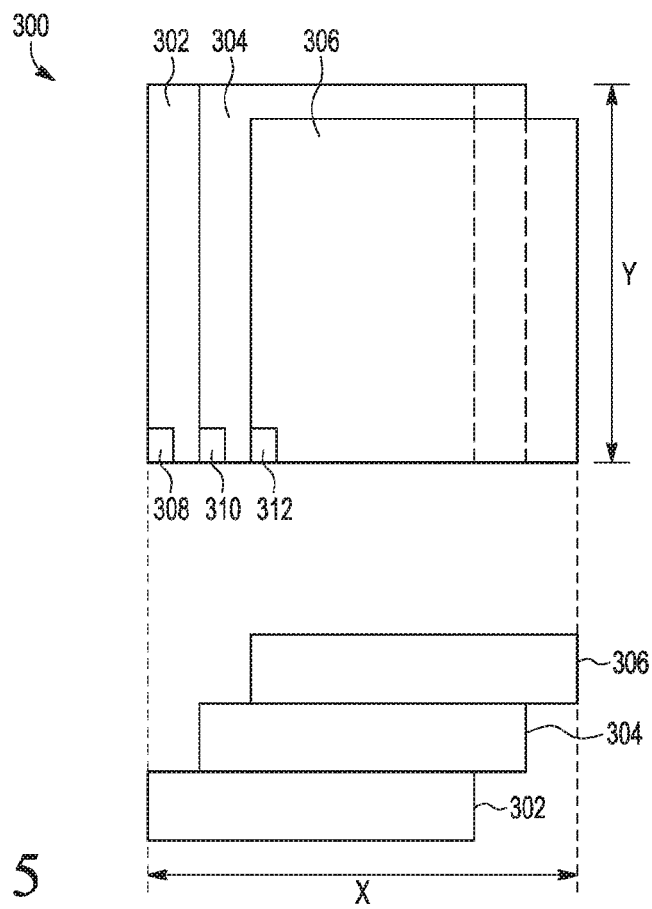
FIG. 5 illustrates, in diagrammatic form, a top down and cross sectional view of a stacked die system, in accordance with one embodiment of the present invention.

FIG. 5 illustrates a top down and cross sectional view of a stacked die system 300, in accordance with one embodiment of the present invention, including die 302, die 304 on die 302, and die 306 on die 304. Each die in system 300 is of a different size and is also not directly aligned with each other. While the example of FIG. 1 includes die which are the same shape and size and are directly aligned with each other, a stacked die system can have other configurations, an example of which is provided in FIG. 5. In system 300, die 304 overlies die 302 but is shifted in comparison to die 302.

Die 306 overlies die 304 but is shifted with respect to die 304 and die 302. Also, the edges of die 306 do not align with die 304 or with die 302. Systems 10, 200, and 300 are example systems, but many other configurations are possible.

FIG. 5 provides an example of global and local coordinates which may be used to communicate bit error location. Each die has a corresponding local origin. Die 306 has a local origin 312, die 304 has a local origin 310, and die 302 has a local origin 308. Therefore, local coordinates, e.g., x, y coordinates, for each die can be provided with respect to its local origin. In the embodiment of FIG. 5, local origin 308 of die 302 is also the global origin of system 300. Therefore, local coordinates can be translated to global coordinates, e.g. x-y coordinates, with respect to the global origin. Each MC can then translate the global coordinates to local coordinates with respect to its local origin. Similarly, note that global and local dimensions can also be used in addition to or in place of coordinates. Note also that some physical locations do not have bit cells in all die levels. For example, a bit error location at the extreme right end of die 306 would not have bit cells at nearby locations in die 304 or 302. In this case, additional scrubs may not need to be performed by every MC in response to that particular location. Also, even if die 304 extended to be underneath the extreme right end of die 306, die 304 may not include bit cells in that region of the die and thus would not need to perform a scrub in response to that location in die 306.

Figure 6:
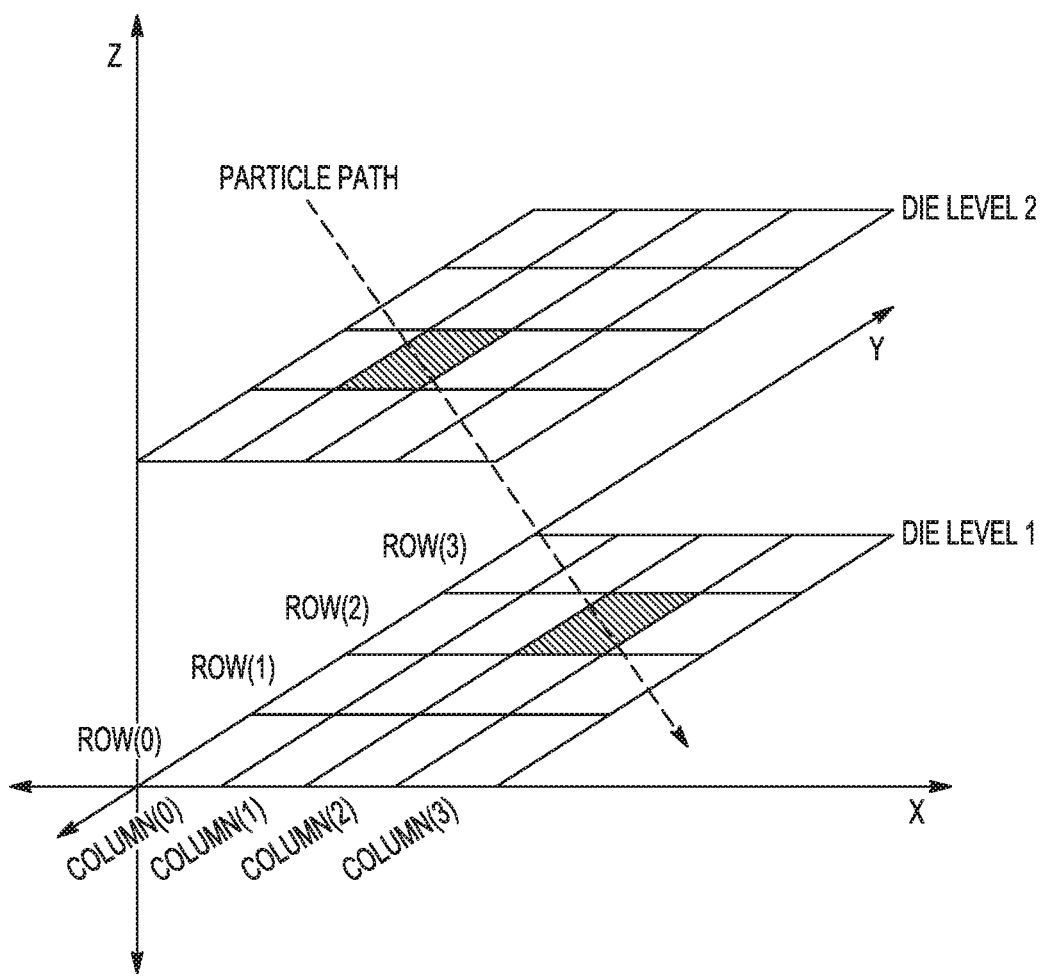
FIG. 6 illustrates, in diagrammatic form, an example particle path through multiple die levels.

FIG. 6 in diagrammatic form, an example particle path through multiple die levels. Therefore, by triggering a scrub in other die levels in response to a bit error in one die level, the 3-D path of the particle can be calculated using the global coordinates of bit errors detected on different die levels. Furthermore, the path can be efficiently checked for bit errors by setting the scrub region in each other die level and not having to do full memory scrubs in any die level.

Therefore, by now it can be appreciated how improved soft error detection and correction can be achieved in stacked die systems. By triggering scrubs in other die levels having nearby memory devices in response to a bit error in one die level, bit errors can be detected and corrected before they remain present long enough to result in an uncorrectable bit error, such as double bit error. Also, in response to a bit error in one die level, a scrub region can be determined in the other die levels using the bit error location information that is sent with the bit error indication. In this manner, a scrub of the scrub region can be performed rather than performing a full memory scrub in the nearby memory device. Furthermore, the processes described herein may be used to ensure that a trail of flipped bits caused by a charged particle can be effectively corrected regardless of which bit in the trail is first detected. By performing searches in different die levels in response to an error in one die level, soft errors within a particle's path can be more timely corrected.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The symbol "$" preceding a number indicates that the number is represented in its hexadecimal or base sixteen form. The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of system 10 are circuitry located on a single integrated circuit or within a same device. Alternatively, system 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, memory 20 may be implemented with different memory types and in different ways and still make use of the improved soft error detection techniques described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) device includes a first memory device; a second memory device stacked with the first memory device; one or more memory controllers configured to: detect a first error in data stored in the first memory device at a first physical location in the IC device, upon detecting the first error, determine whether there is a second error in data stored in the second memory device in a second physical location in the IC device near the first physical location. In one aspect, the one or more memory controllers are further configured to: translate an address of the first physical location to an address at the second physical location. In a further aspect, the first and second memory devices have a same size. In another further aspect, the first memory device has a different size than the second memory device. In yet a further aspect, the memory controller is configured to determine the first physical location and the second physical location based on an origin and coordinates or dimensions of the first and second memory devices. In yet an even further aspect, the memory controller is configured to test multiple physical locations in the IC device near the first physical location to determine whether there is the second error in the data in the second memory device. In another aspect of the above one embodiment, the first memory device is coupled to a first of the one or more memory controllers; the second memory device is coupled to a second of the one or more memory controllers, the first of the one or more memory controllers is configured to communicate the address or the location of the first error to the second of the one or more memory controller, and the second memory controller determines whether the second error is based on the address or the location of the first error. In another aspect, the one or more memory controllers are configured to correct the first and second errors. In yet another aspect, the first and second memory devices are coupled to a single one of the one or more memory controllers.

In another embodiment, a packaged integrated circuit device includes a first memory device including bit cells; a second memory device including bit cells; one or more memory controllers configured to detect an error in data in one of the bit cells in the first memory device and, based on an address of the one of the bit cells, determine whether there is an error in data of a bit cell in a location of the second memory device near the address of the one of the bit cells in the first memory device. In one aspect, the first and second memory devices are stacked with each other. In another aspect, the device further includes a third memory device including bit cells, wherein the one or more memory controllers is configured to, based on an address of the one of the bit cells, determine whether there is an error in data of a bit cell in a location of the third memory device near the address of the one of the bit cells in the first memory device. In a further aspect, the third memory device is stacked with the first and second memory devices. In yet a further aspect, at least one of the first, second, and third memory devices has a different size than another of the first, second and third memory devices. In another aspect of the above another embodiment, the first memory device is coupled to a first of the one or more memory controllers, the second memory device is coupled to a second of the one or more memory controllers.

In yet another embodiment, a method of operating a first memory device and a second memory device, includes detecting an error in a bit cell of the first memory device; determining an address of the bit cell with the error; determining a range of addresses of bit cells in the second memory device, wherein the range of addresses correspond to locations near a location of the address of the bit cell with the error in the first memory device; detecting whether there is another error in one or more of the bit cells in the range of addresses in the second memory device; and correcting the error in the bit cell of the first memory device; and if the other error is detected, correcting the other error in the second memory device. In one aspect, the first and second memory devices are stacked with one another. In another aspect, the method further includes determining the range of addresses based on an origin location of the first and second devices. In yet another aspect, the method further includes using a first memory controller coupled to the first and second memory devices to detect the error and the other error. In yet another aspect, the method further includes using a first memory controller coupled to the first memory device to detect the error; and using a second memory controller coupled to the second memory device to detect the other error.

What is claimed is:

1. An integrated circuit (IC) device comprising:
  a first memory device having a first set of bit cells arranged in a first plane;
  a second memory device having a second set of bit cells arranged in a second plane oriented in parallel to the first plane and physically stacked with regard to the first memory device to physically overlay the first memory device with a portion of the second set of bit cells physically overlaying the first set of bit cells between external interconnects; and one or more memory controllers configured to:

detect a first error in data stored in the first memory device at a first physical location in the IC device, upon detecting the first error, determine whether there is a second error in data stored in the second memory device in a second physical location in the IC device near the first physical location, and translate an address of the first physical location to an address at the second physical location and determine the first physical location and the second physical location based on an origin and coordinates or dimensions of the first and second memory devices.

2. The integrated circuit device of claim 1 wherein:
the first and second memory devices have a same size.

3. The integrated circuit device of claim 1 wherein:
the first memory device has a different size than the second memory device.

4. The integrated circuit device of claim 1 wherein:
a memory controller of the one or more memory controllers is configured to test multiple physical locations in the IC device near the first physical location to determine whether there is the second error in the data in the second memory device.

5. The integrated circuit device of claim 1 wherein:
the first memory device is coupled to a first of the one or more memory controllers;
the second memory device is coupled to a second of the one or more memory controllers,
the first of the one or more memory controllers is configured to communicate the address or the location of the first error to the second of the one or more memory controller, and
the second memory controller determines whether the second error is based on the address or the location of the first error.

6. The integrated circuit device of claim 1 wherein:
the one or more memory controllers are configured to correct the first and second errors.

7. The integrated circuit device of claim 1 wherein:
the first and second memory devices are coupled to a single one of the one or more memory controllers.

8. The integrated circuit device of claim 1 wherein:
the one or more memory controllers are at the same die.

9. The integrated circuit device of claim 1 wherein:
the first memory device includes a first die and the second memory device includes a second die distinct from the first die.

10. A packaged integrated circuit device comprising:
a first memory device including first bit cells positioned on a first plane;
a second memory device including second bit cells positioned on a second plane oriented in parallel to the first plane, wherein the first and second memory devices are physically stacked with regard to each other and the second bit cells physically overlay the first bit cells between external interconnects;
one or more memory controllers configured to detect an error in data in one of the bit cells in the first memory device and, based on an address of the one of the bit cells, determine whether there is an error in data of a bit cell in a location of the second memory device near the address of the one of the bit cells in the first memory device.

11. The device of claim 10 further comprising:
a third memory device including bit cells, wherein the one or more memory controllers is configured to, based on an address of the one of the bit cells, determine whether there is an error in data of a bit cell in a location of the third memory device near the address of the one of the bit cells in the first memory device.

12. The device of claim 11 wherein the third memory device is stacked with the first and second memory devices.

13. The device of claim 12 wherein at least one of the first, second, and third memory devices has a different size than another of the first, second and third memory devices.

14. The device of claim 10 wherein the first memory device is coupled to a first of the one or more memory controllers, the second memory device is coupled to a second of the one or more memory controllers.

15. A method of detecting errors in a memory device, comprising:
detecting an error in a bit cell of a first memory device;
determining an address of the bit cell with the error;
determining a range of addresses of bit cells in a second memory device physically stacked with regard to the first memory device to physically overlay the first memory device and the bit cell of the first memory device between external interconnects, wherein the range of addresses correspond to locations near a location of the address of the bit cell with the error in the first memory device;
detecting whether there is another error in one or more of the bit cells in the range of addresses in the second memory device; and
correcting the error in the bit cell of the first memory device; and
if the other error is detected, correcting the other error in the second memory device.

16. The method of claim 15 further comprising:
determining the range of addresses based on an origin location of the first and second devices.

17. The method of claim 15 further comprising:
using a first memory controller coupled to the first and second memory devices to detect the error and the other error.

18. The method of claim 15 wherein:
using a first memory controller coupled to the first memory device to detect the error; and
using a second memory controller coupled to the second memory device to detect the other error.

* * * * *